US009105835B2

(12) United States Patent
Ibata et al.

(10) Patent No.: US 9,105,835 B2
(45) Date of Patent: Aug. 11, 2015

(54) AIR-COUPLED ULTRASONIC SENSOR

(75) Inventors: Koji Ibata, Tokyo (JP); Tomonori Kimura, Tokyo (JP); Satoru Inoue, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 337 days.

(21) Appl. No.: 13/822,308

(22) PCT Filed: Dec. 10, 2010

(86) PCT No.: PCT/JP2010/072221
§ 371 (c)(1),
(2), (4) Date: Mar. 12, 2013

(87) PCT Pub. No.: WO2012/077224
PCT Pub. Date: Jun. 14, 2012

(65) Prior Publication Data
US 2013/0169111 A1    Jul. 4, 2013

(51) Int. Cl.
*H01L 41/053* (2006.01)
*G10K 9/122* (2006.01)
*G01S 7/521* (2006.01)

(52) U.S. Cl.
CPC .............. *H01L 41/053* (2013.01); *G01S 7/521* (2013.01); *G10K 9/122* (2013.01)

(58) Field of Classification Search
CPC .... H04R 17/00; B06B 1/0603; B06B 1/0622; G10K 11/02
USPC ..................................... 310/322, 323.21, 334
See application file for complete search history.

(56) References Cited

U.S. PATENT DOCUMENTS

| 5,962,952 | A  | * | 10/1999 | Gluszyk et al. | ............... | 310/324 |
| 7,548,014 | B2 | * | 6/2009  | Asada et al.   | .................. | 310/348 |
| 2004/0113522 | A1 | * | 6/2004 | Nagahara et al. | ............. | 310/326 |
| 2006/0107733 | A1 | * | 5/2006 | Aastrup et al. | ............... | 73/64.53 |

(Continued)

FOREIGN PATENT DOCUMENTS

| JP | 55 162487 | 11/1980 |
| JP | 58 152096 | 10/1983 |
| JP | 59 9696 | 1/1984 |
| JP | 1 190097 | 7/1989 |

(Continued)

OTHER PUBLICATIONS

International Search Report Issued Jan. 25, 2011 in PCT/JP10/72221 Filed Dec. 10, 2010.

*Primary Examiner* — Derek Rosenau
*Assistant Examiner* — Bryan Gordon
(74) *Attorney, Agent, or Firm* — Oblon, McClelland, Maier & Neustadt, L.L.P.

(57) ABSTRACT

An air-coupled ultrasonic sensor capable of changing setting of an output sound pressure or an ultrasonic wave propagation distance depending on a use application, an installation site, or the like, with a simple structure. An air-coupled ultrasonic sensor includes: a closed-end cylindrical case including an opening portion at one end in its axial direction and a bottom surface at another end; a piezoelectric oscillator firmly fixed onto an inner bottom surface of the closed-end cylindrical case; an open-end cylindrical case including opening portions at both ends in its axial direction; and a thin film firmly fixed on one of the opening portions at one end of the open-end cylindrical case. The open-end cylindrical case is fitted to the closed-end cylindrical case, and includes a structure capable of moving along a side wall of the closed-end cylindrical case.

4 Claims, 4 Drawing Sheets

(56) References Cited

U.S. PATENT DOCUMENTS

2008/0161693 A1* 7/2008 Prager et al. .................. 600/459
2012/0204647 A1 8/2012 Kimura et al.
2012/0269039 A1* 10/2012 Ibata et al. .................... 367/180

FOREIGN PATENT DOCUMENTS

| JP | 4 238496 | 8/1992 |
|----|----------|--------|
| JP | 6 269090 | 9/1994 |
| JP | 8 65795  | 3/1996 |

* cited by examiner

AIR-COUPLED ULTRASONIC SENSOR

TECHNICAL FIELD

The present invention relates to an air-coupled ultrasonic sensor for transmitting ultrasonic waves to air or receiving ultrasonic waves that have propagated through air.

BACKGROUND ART

An air-coupled ultrasonic sensor using a piezoelectric element is utilized for an obstacle detection system for detecting an obstacle or other systems. Such an obstacle detection system transmits ultrasonic waves to air from an air-coupled ultrasonic sensor. The transmitted ultrasonic waves are reflected by an obstacle or the like, and propagates through the air. The air-coupled ultrasonic sensor receives again the ultrasonic waves, to thereby detect the obstacle.

In order to lengthen an ultrasonic wave propagation distance of the air-coupled ultrasonic sensor, it is necessary to increase an output sound pressure of ultrasonic waves. As a method of increasing the output sound pressure, there is known a method of utilizing an acoustic matching layer for matching acoustic impedance of the air-coupled ultrasonic sensor with acoustic impedance of air. An example thereof is an air-coupled ultrasonic sensor in which a low-density region is provided in a case portion of the air-coupled ultrasonic sensor and the low-density region is used as an acoustic matching layer (see, for example, Patent Literature 1).

Patent Literature 1 discloses an air-coupled ultrasonic sensor in which a piezoelectric oscillator is housed in the case portion and an acoustic matching layer is provided on an ultrasonic wave radiation surface of the oscillator. In the air-coupled ultrasonic sensor, a low-density region is formed at a mounting portion of the piezoelectric oscillator at the time of molding the case portion, and the low-density region is used as the acoustic matching layer.

In the air-coupled ultrasonic sensor disclosed in Patent Literature 1, the piezoelectric oscillator is mounted at the case portion, and the mounting portion is the low-density region formed at the time of molding the case portion. The low-density region of the case portion has lower acoustic impedance than in other regions, and hence the low-density region operates as the acoustic matching layer so that the output sound pressure of the air-coupled ultrasonic sensor can be increased. The output sound pressure corresponds to the ultrasonic wave propagation distance. Thus, when the output sound pressure is increased, the ultrasonic wave propagation distance can be lengthened.

CITATION LIST

Patent Literature

[PTL 1] JP 1-190097 A

SUMMARY OF INVENTION

Technical Problem

The conventional technology, however, has the following problems.

In the air-coupled ultrasonic sensor as disclosed in Patent Literature 1, the acoustic matching layer is formed at the time of molding the case portion as described above. Therefore, once the air-coupled ultrasonic sensor is formed, the output sound pressure, namely the ultrasonic wave propagation distance, is determined to be unique.

Thus, in order to change the output sound pressure (ultrasonic wave propagation distance) depending on the use application, the installation site, or the like of the air-coupled ultrasonic sensor, it is necessary to reform the acoustic matching layer for obtaining a desired output sound pressure (ultrasonic wave propagation distance) in accordance with the change. As a result, there is a problem in terms of manufacturing cost.

Further, as described above, once the air-coupled ultrasonic sensor is formed, the output sound pressure (ultrasonic wave propagation distance) is determined to be unique, and hence there is another problem that the output sound pressure (ultrasonic wave propagation distance) cannot be adjusted finely.

The present invention has been made in order to solve the above-mentioned problems, and it is an object thereof to provide an air-coupled ultrasonic sensor capable of easily changing setting of an output sound pressure (ultrasonic wave propagation distance) depending on the use application, the installation site, or the like with a simple structure.

Solution to Problem

According to the present invention, there is provided an air-coupled ultrasonic sensor, including: a closed-end cylindrical case including an opening portion at one end in its axial direction and a bottom surface at another end; a piezoelectric oscillator firmly fixed onto an inner bottom surface of the closed-end cylindrical case; an open-end cylindrical case including opening portions at both ends in its axial direction; and a thin film firmly fixed on one of the opening portions at one end of the open-end cylindrical case, in which the open-end cylindrical case is fitted to the closed-end cylindrical case, and has a structure capable of moving along a side wall of the closed-end cylindrical case.

Advantageous Effects of Invention

According to the air-coupled ultrasonic sensor of the present invention, the open-end cylindrical case having the thin film firmly fixed thereon is fitted to the closed-end cylindrical case having the piezoelectric oscillator firmly fixed thereon, and the open-end cylindrical case is structured to be movable along the side wall of the closed-end cylindrical case. Therefore, it is possible to obtain the air-coupled ultrasonic sensor capable of easily changing the setting of the output sound pressure (ultrasonic wave propagation distance) depending on the use application, the installation site, or the like with a simple structure.

DESCRIPTION OF EMBODIMENTS

Now, air-coupled ultrasonic sensors according to exemplary embodiments of the present invention are described with reference to the accompanying drawings. Note that, like components in the following drawings are denoted by like reference symbols.

First Embodiment

Figure 1:
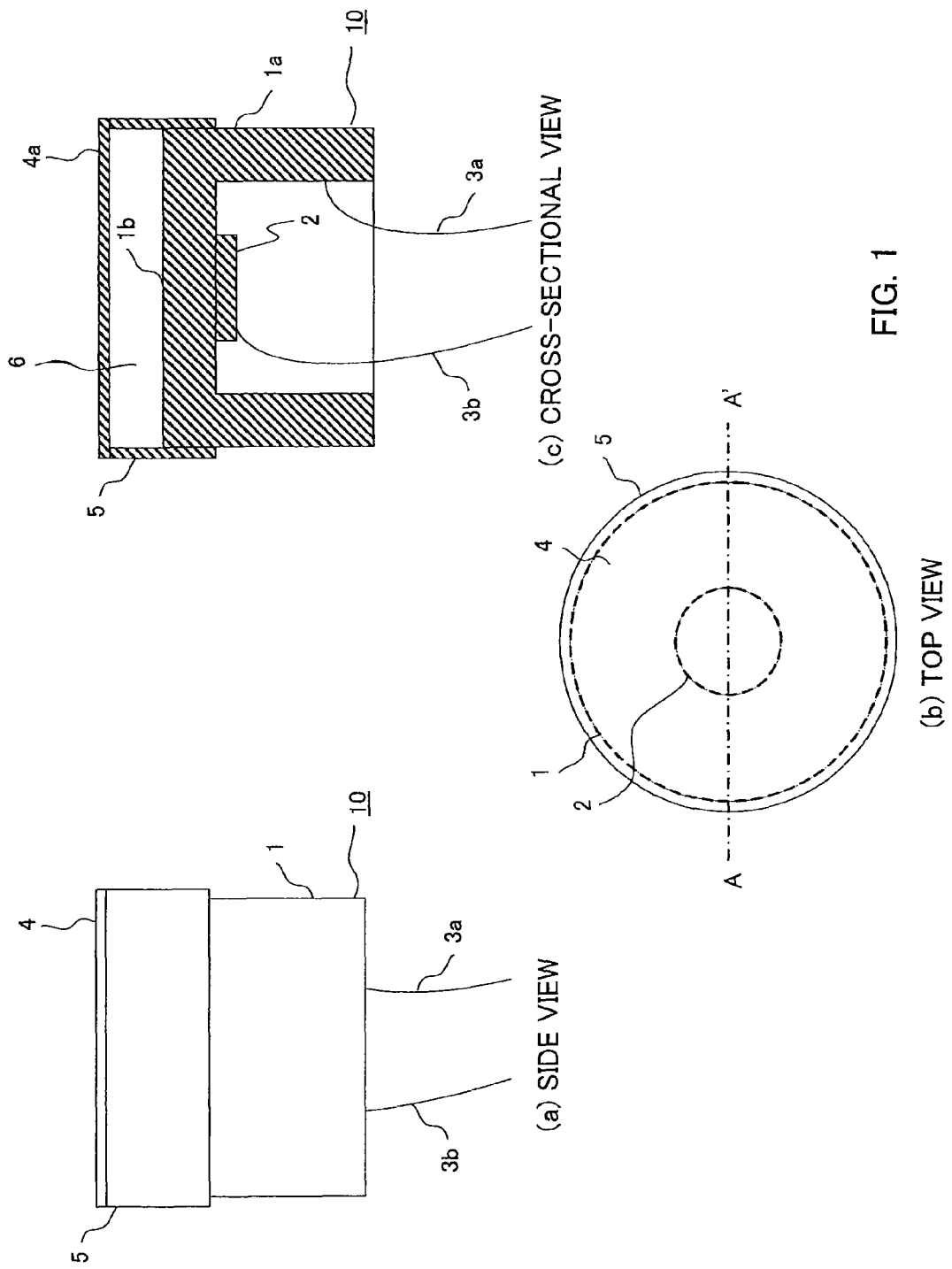
FIG. 1 Schematic views illustrating an air-coupled ultrasonic sensor according to a first embodiment of the present invention.

FIG. 1 are schematic views illustrating an air-coupled ultrasonic sensor according to a first embodiment of the present invention. FIG. 1(a) is a side view, FIG. 1(b) is a top view, and FIG. 1(c) is a cross-sectional view taken along the line A-A' illustrated in FIG. 1(b). An air-coupled ultrasonic sensor 10 illustrated in FIG. 1 includes a closed-end cylindrical case 1, a piezoelectric oscillator 2, input/output terminals 3a and 3b, a thin film 4, and an open-end cylindrical case 5.

The closed-end cylindrical case 1 is a case having an opening portion at one end in its axial direction and a bottom surface at the other end. The piezoelectric oscillator 2 is firmly fixed onto an inner bottom surface of the closed-end cylindrical case 1. The air-coupled ultrasonic sensor 10 further includes the input/output terminals 3a and 3b.

The open-end cylindrical case 5 has both open ends, and an opening portion at one end has the thin film 4 firmly fixed thereon while an opening portion at the other end is fitted to the closed-end cylindrical case 1. In this case, the air-coupled ultrasonic sensor 10 according to the present invention has the technical feature in that the open-end cylindrical case 5 is structured to be movable along a side wall 1a of the closed-end cylindrical case 1.

The input/output terminal 3a is connected to the closed-end cylindrical case 1. The input/output terminal 3b, on the other hand, is connected to a surface of the piezoelectric oscillator 2 opposite to an adhesive surface of the closed-end cylindrical case 1. The closed-end cylindrical case 1 and the open-end cylindrical case 5 are made of, for example, a resin having a relatively high rigidity reinforced by glass cloth, or a metal such as aluminum.

The piezoelectric oscillator 2 is made of a piezoelectric ceramic such as PZT or barium titanate, and is formed into a disc shape. The thin film 4 is made of a synthetic resin material such as vinyl chloride.

In the air-coupled ultrasonic sensor 10 according to the first embodiment of the present invention, a signal of a predetermined frequency is supplied to the input/output terminals 3a and 3b from a signal source (not shown). With the application of such a signal, the piezoelectric oscillator 2 expands and contracts mainly in a radial direction to oscillate. When the piezoelectric oscillator 2 oscillates in this manner, the closed-end cylindrical case 1 is oscillated, and further, the thin film 4 firmly fixed on the open-end cylindrical case 5 is oscillated so that ultrasonic waves are radiated to air from a radiation surface 4a of the thin film 4.

As described above, in the present invention, the open-end cylindrical case 5 having the thin film 4 firmly fixed thereon is fitted to the closed-end cylindrical case 1 having the piezoelectric oscillator 2 firmly fixed thereon, and the open-end cylindrical case 5 is structured to be movable along the side wall 1a of the closed-end cylindrical case 1. Therefore, the distance between an outer bottom surface 1b of the closed-end cylindrical case 1 and the thin film 4 can be changed. In other words, the thickness of an air layer 6 present between the outer bottom surface 1b of the closed-end cylindrical case 1 and the thin film 4 can be changed.

Figure 2:
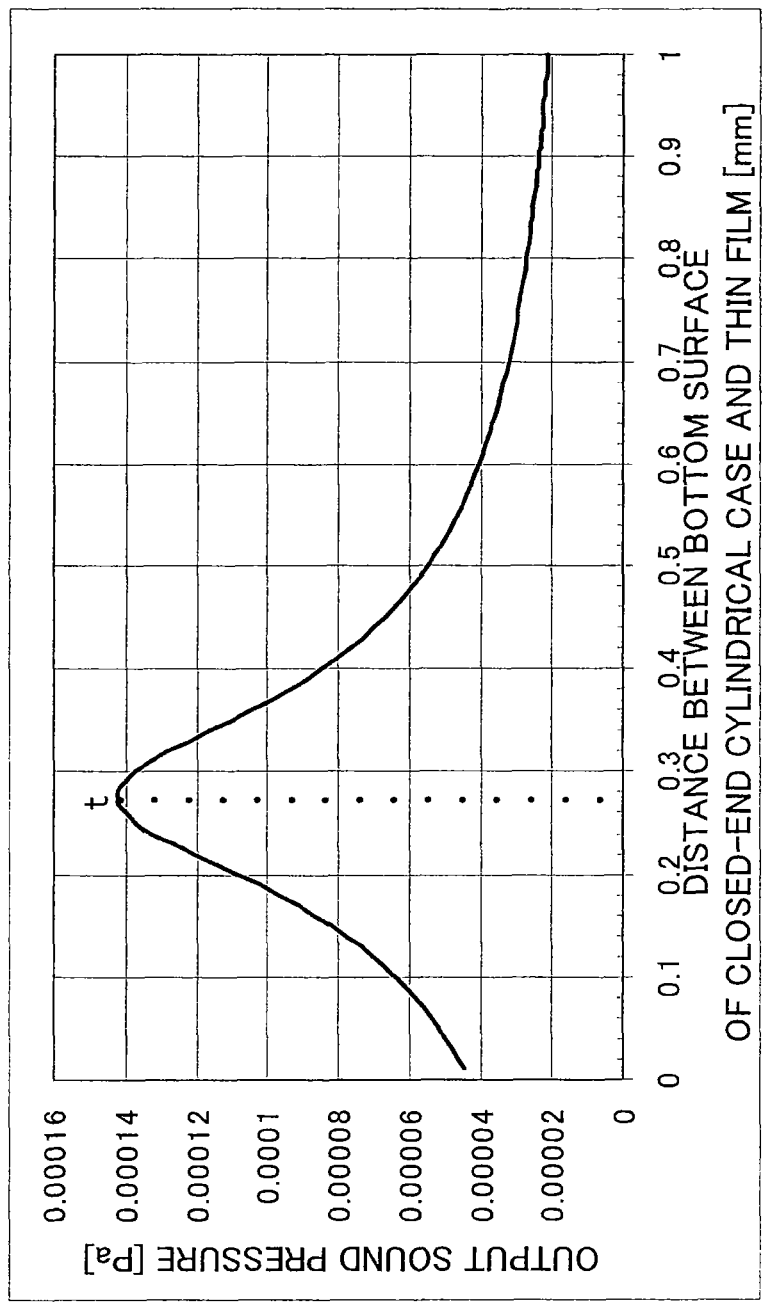
FIG. 2 A graph showing a relationship between a distance between an outer bottom surface of a closed-end cylindrical case and a thin film and an output sound pressure in the air-coupled ultrasonic sensor according to the first embodiment of the present invention.

In this case, the thin film 4 operates as an acoustic matching layer together with the air layer 6 present between the outer bottom surface 1b of the closed-end cylindrical case 1 and the thin film 4. Then, acoustic impedance can be changed by the thickness of the air layer 6. FIG. 2 is a graph showing a relationship between the distance between the outer bottom surface 1b of the closed-end cylindrical case 1 and the thin film 4 and an output sound pressure in the air-coupled ultrasonic sensor 10 according to the first embodiment of the present invention. Note that, FIG. 2 shows the relationship in the case where vinyl chloride is assumed as the thin film 4.

As shown in FIG. 2, the output sound pressure increases as the distance between the outer bottom surface 1b of the closed-end cylindrical case 1 and the thin film 4 becomes larger. The output sound pressure has a peak at a thickness of t (0.27 mm in FIG. 2), and decreases again as the thickness becomes larger than t. In other words, the output sound pressure can be changed by changing the distance between the outer bottom surface 1b of the closed-end cylindrical case 1 and the thin film 4.

In accordance with the propagation distance of ultrasonic waves radiated from the air-coupled ultrasonic sensor 10, when the output sound pressure becomes higher, the ultrasonic wave propagation distance becomes longer. Therefore, the ultrasonic wave propagation distance can be changed by changing the distance between the outer bottom surface 1b of the closed-end cylindrical case 1 and the thin film 4.

As described above, according to the air-coupled ultrasonic sensor of the first embodiment, the open-end cylindrical case having the thin film firmly fixed thereon is fitted to the air-coupled ultrasonic sensor, and the open-end cylindrical case has a structure capable of moving along the side wall of the closed-end cylindrical case. As a result, the distance between the outer bottom surface of the closed-end cylindrical case and the thin film can be arbitrarily set, and hence it is possible to obtain an air-coupled ultrasonic sensor capable of arbitrarily setting the output sound pressure (ultrasonic wave propagation distance) depending on the use application, the installation site, or the like with a simple structure.

Second Embodiment

In a second embodiment of the present invention, a description is given of specific means for configuring the open-end cylindrical case 5 to be movable along the side wall 1a of the closed-end cylindrical case 1.

Figure 3:
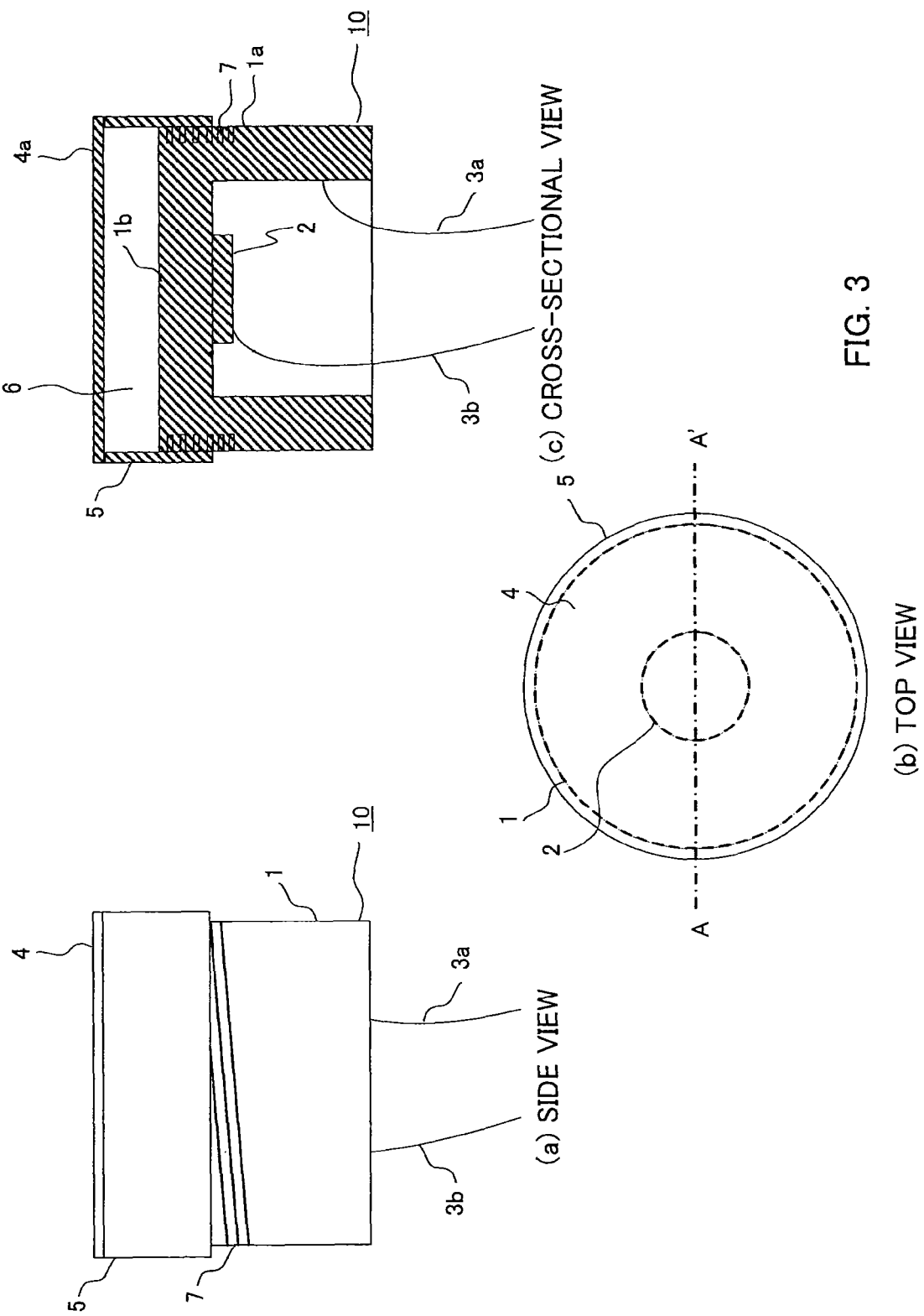
FIG. 3 Schematic views illustrating an air-coupled ultrasonic sensor according to a second embodiment of the present invention.

FIG. 3 are schematic views illustrating an air-coupled ultrasonic sensor according to the second embodiment of the present invention. FIG. 3(a) is a side view, FIG. 3(b) is a top view, and FIG. 3(c) is a cross-sectional view taken along the line A-A' illustrated in FIG. 3(b).

The air-coupled ultrasonic sensor 10 illustrated in FIG. 3 includes the closed-end cylindrical case 1, the piezoelectric oscillator 2, the input/output terminals 3a and 3b, the thin film 4, and the open-end cylindrical case 5. Note that, the configurations other than the closed-end cylindrical case 1 and the open-end cylindrical case 5 are the same as in FIG. 1 of the above-mentioned first embodiment, and hence descriptions thereof are omitted.

In the air-coupled ultrasonic sensor 10 according to the second embodiment of the present invention, spiral grooves 7 are provided in an outer side surface of the closed-end cylindrical case 1 and an inner side surface of the open-end cylindrical case 5, and the closed-end cylindrical case 1 and the open-end cylindrical case 5 have a relationship of a male screw and a female screw. Therefore, by rotating the closed-end cylindrical case 1 or the open-end cylindrical case 5, the open-end cylindrical case 5 can be moved along the side wall 1*a* of the closed-end cylindrical case 1.

As described above, the air-coupled ultrasonic sensor according to the second embodiment has the simple structure in which the spiral grooves are provided in the outer side surface of the closed-end cylindrical case and the inner side surface of the open-end cylindrical case, and hence the open-end cylindrical case can be moved along the side wall of the closed-end cylindrical case so as to change the distance between the outer bottom surface of the closed-end cylindrical case and the thin film. As a result, the air-coupled ultrasonic sensor capable of arbitrarily setting the output sound pressure (ultrasonic wave propagation distance) depending on the use application, the installation site, or the like can be realized with a simple structure.

Third Embodiment

In a third embodiment of the present invention, a description is given of a structure that visualizes the positional relationship between the open-end cylindrical case 5 and the closed-end cylindrical case 1 in order to obtain a desired output sound pressure (desired ultrasonic wave propagation distance) with good reproducibility depending on the use application, the installation site, or the like.

Figure 4:
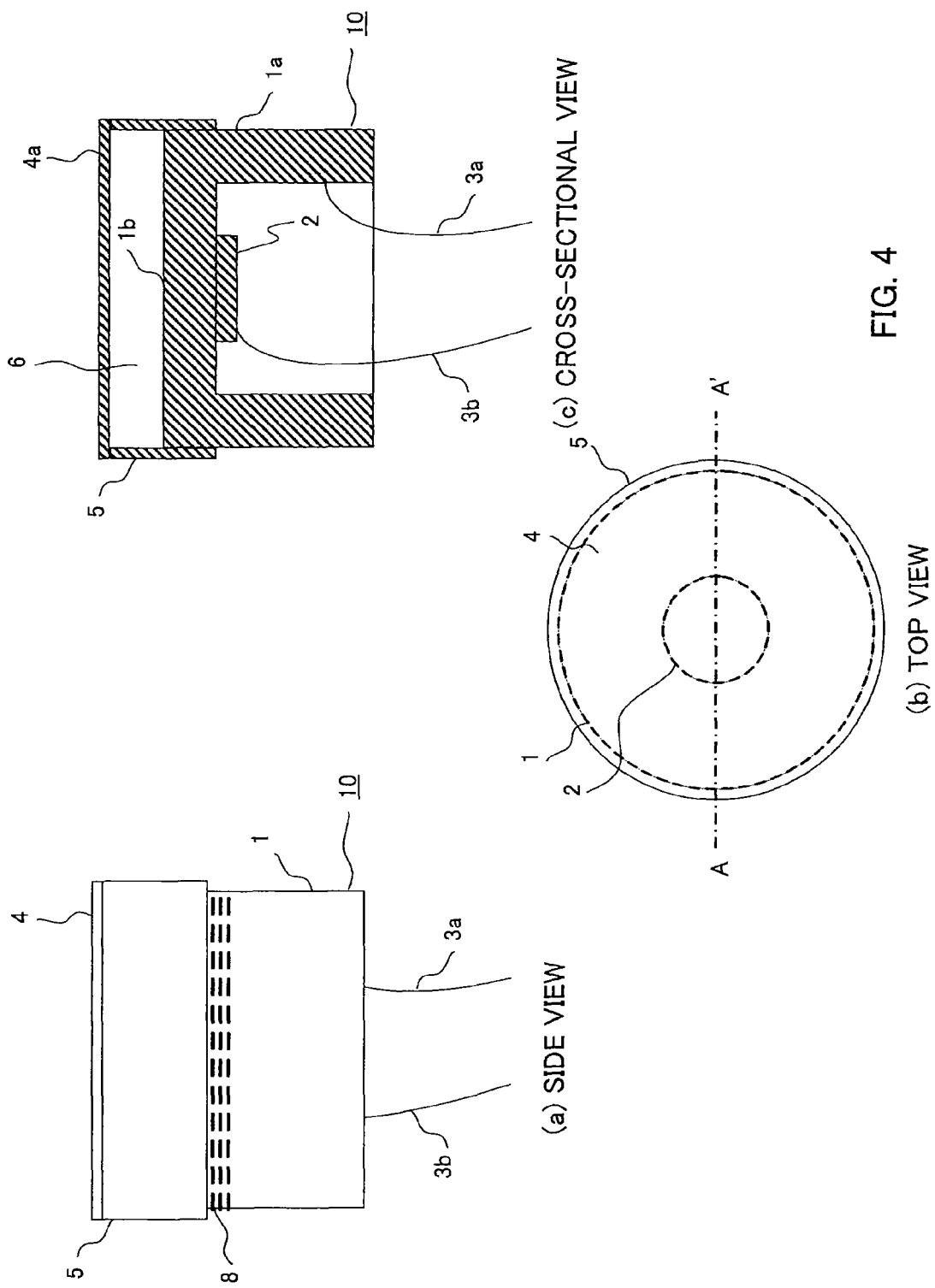
FIG. 4 Schematic views illustrating an air-coupled ultrasonic sensor according to a third embodiment of the present invention.

FIG. 4 are schematic views illustrating an air-coupled ultrasonic sensor according to the third embodiment of the present invention. FIG. 4(*a*) is a side view, FIG. 4(*b*) is a top view, and FIG. 4(*c*) is a cross-sectional view taken along the line A-A' illustrated in FIG. 4(*b*).

The air-coupled ultrasonic sensor 10 illustrated in FIG. 4 includes the closed-end cylindrical case 1, the piezoelectric oscillator 2, the input/output terminals 3*a* and 3*b*, the thin film 4, and the open-end cylindrical case 5. Note that, the configurations other than the closed-end cylindrical case 1 are the same as in the above-mentioned first embodiment, and hence descriptions thereof are omitted.

In the air-coupled ultrasonic sensor 10 according to the third embodiment of the present invention, a scale 8 for visually identifying the distance between the outer bottom surface 1*b* of the closed-end cylindrical case 1 and the thin film 4 is provided on the outer side surface of the closed-end cylindrical case 1. The scale 8 is determined based on a predetermined relationship between the distance between the outer bottom surface 1*b* of the closed-end cylindrical case 1 and the thin film 4 and the output sound pressure (or the ultrasonic wave propagation distance).

As described above, the air-coupled ultrasonic sensor according to the third embodiment has the structure provided with the scale on the outer side surface of the closed-end cylindrical case, and hence the relative position of the closed-end cylindrical case 1 with respect to the open-end cylindrical case 5 can be adjusted easily to a position for obtaining a desired output sound pressure (desired ultrasonic wave propagation distance) depending on the use application, the installation site, or the like. As a result, with a simple structure, the air-coupled ultrasonic sensor capable of arbitrarily setting the output sound pressure (ultrasonic wave propagation distance) depending on the use application, the installation site, or the like can be realized, and the reproducibility of the output sound pressure or the ultrasonic wave propagation distance can be improved.

Note that, in FIG. 4 in the third embodiment of the present invention, the description has been given of the case where the scale 8 is added to the structure of FIG. 1 in the above-mentioned first embodiment. However, the third embodiment of the present invention is not limited to this structure. The scale 8 can be added to the structure of FIG. 3 in the above-mentioned second embodiment, and it is possible to achieve both the facilitation of position adjustment and the reproducibility of the output sound pressure (ultrasonic wave propagation distance).

The invention claimed is:

1. An air-coupled ultrasonic sensor, comprising:
   a closed-end cylindrical case including an opening portion at one end in its axial direction and a bottom surface at another end;
   a piezoelectric oscillator firmly fixed onto an inner bottom surface of the closed-end cylindrical case;
   an open-end cylindrical case including opening portions at both ends in its axial direction; and
   a thin film firmly fixed on one of the opening portions at one end of the open-end cylindrical case,
   wherein the open-end cylindrical case is fitted to the closed-end cylindrical case, and has a structure capable of moving along a side wall of the closed-end cylindrical case.

2. An air-coupled ultrasonic sensor according to claim 1, wherein the closed-end cylindrical case has a spiral groove provided in an outer side surface thereof, and the open-end cylindrical case has a spiral groove provided in an inner side surface thereof, the spiral grooves serving as the fitting and the movable structure.

3. An air-coupled ultrasonic sensor according to claim 1, wherein the closed-end cylindrical case has a scale provided on the side wall thereof, for visually identifying a distance between the bottom surface of the closed-end cylindrical case and the thin film.

4. An air-coupled ultrasonic sensor according to claim 2, wherein the closed-end cylindrical case has a scale provided on the side wall thereof, for visually identifying a distance between the bottom surface of the closed-end cylindrical case and the thin film.

* * * * *